(12) United States Patent
Heinrich et al.

(10) Patent No.: US 8,192,598 B2
(45) Date of Patent: Jun. 5, 2012

(54) END-BLOCK FOR A MAGNETRON DEVICE WITH A ROTATABLE TARGET, AND VACUUM COATING APPARATUS

(75) Inventors: Hans-Juergen Heinrich, Grossroehrsdorf (DE); Goetz Grosser, Dresden (DE); Sven Haehne, Dresden (DE); Ulf Seyfert, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 409 days.

(21) Appl. No.: 12/504,700

(22) Filed: Jul. 17, 2009

(65) Prior Publication Data

US 2010/0012489 A1  Jan. 21, 2010

(30) Foreign Application Priority Data

Jul. 18, 2008 (DE) .................. 10 2008 033 902

(51) Int. Cl.
*C23C 14/35* (2006.01)
(52) U.S. Cl. .............. 204/298.21; 204/298.22
(58) Field of Classification Search ............ 204/298.21, 204/298.22
See application file for complete search history.

(56) References Cited

U.S. PATENT DOCUMENTS

| 5,620,577 A | 4/1997 | Taylor |
| 6,736,948 B2 * | 5/2004 | Barrett ............ 204/298.22 |
| 2007/0051304 A1 | 3/2007 | Sauer |

FOREIGN PATENT DOCUMENTS

| EP | 0698909 A2 | 2/1996 |
| WO | 2006007504 A1 | 1/2006 |
| WO | 2007147757 A1 | 12/2007 |

* cited by examiner

*Primary Examiner* — Rodney McDonald
(74) *Attorney, Agent, or Firm* — Heslin Rothenberg Farley & Mesiti P.C.

(57) ABSTRACT

An end block for a magnetron device having a rotatable target comprises an end block housing having a pivot bearing. The end block housing is adapted on its outer side for attachment on a support unit, and the pivot bearing is adapted on an end that is accessible from outside the end block housing, for connection to the rotatable target. The end block housing is movably attached on the support unit. A vacuum coating apparatus has a vacuum chamber, a magnetron device situated in the vacuum chamber, and a rotatable target rotatably mounted on at least one such end block.

9 Claims, 1 Drawing Sheet

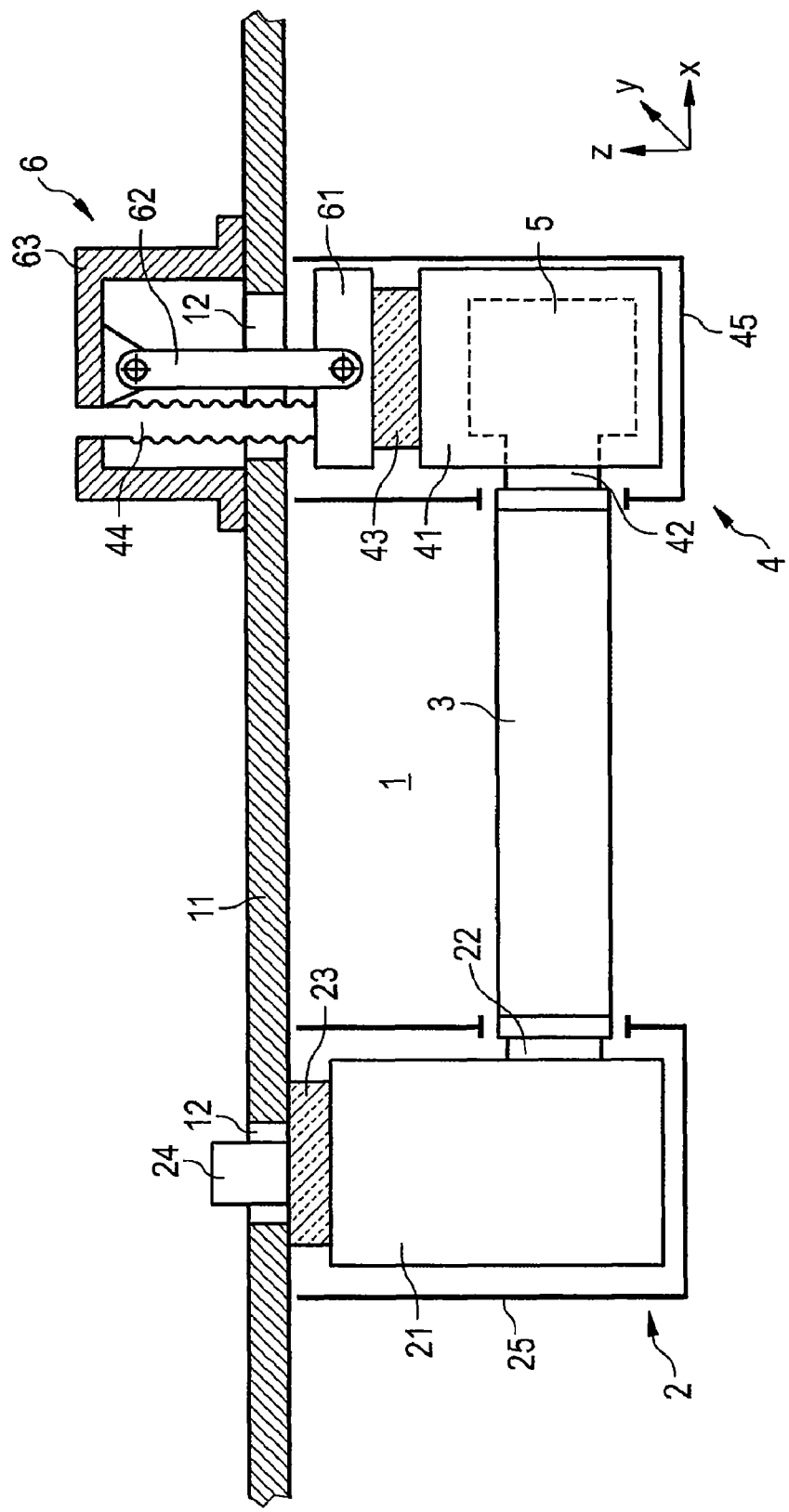

END-BLOCK FOR A MAGNETRON DEVICE WITH A ROTATABLE TARGET, AND VACUUM COATING APPARATUS

CROSS REFERENCE TO RELATED APPLICATIONS

This application claims priority of German application No. 10 2008 033 902.4 filed on Jul. 18, 2008, the entire disclosure of this application being hereby incorporated herein by reference.

BACKGROUND ART

An end block for a magnetron device having a rotatable target and a vacuum coating apparatus having a magnetron device of this type are described hereafter, which are simply constructed and maintenance-friendly.

So-called rotatable magnetrons are known in vacuum coating technology, in which a typically tubular target encloses a magnetic device, the tubular target being mounted so it is rotatable and being drivable, so that the target material is ablated uniformly. The tubular target is typically fastened between two end blocks in the vacuum chamber of a vacuum coating apparatus, which are designed so that they each allow the rotatable mounting of the tubular target. Different functions are typically assigned to the two end blocks for this purpose. One of the end blocks is typically implemented as a supply block for supplying the magnetron with cooling water and electrical power and the other end block is implemented as a drive end block for introducing a torque to generate the rotation of the tubular target.

Known end blocks, both supply end blocks and also drive end blocks, are typically connected fixed to a support unit, such as the chamber wall or the chamber cover of a vacuum coating apparatus, either directly or via a spacer part, which is used to influence the spacing between magnetron and substrate. End blocks of this type are known, for example, from DE 10 2007 049 735 A1 and WO 2007/147757 A1. Therefore, the spacing between the two end blocks is predefined fixed on the basis of the target length, which is predetermined by the application. However, the free space between the end blocks which is available for the target mounting is restricted greatly by this fixed spacing of the end blocks. Unequal spacings to the dark field shields typically provided on the end blocks may result at the ends of the target. Upon processing-related heating of the target tube and the length expansion resulting therefrom, the dark field spacing changes on one side and the engagement point of the coupling element, which is typically fastened on the end of the target in order to tap the torque from a drive shaft, is displaced. In addition, the length of the target tubes must be within very narrow tolerances.

BRIEF SUMMARY OF THE INVENTION

Therefore, an improved end block is disclosed, in which the requirements for the manufacturing tolerances of the components are less than in known end blocks, the mounting and dismounting of the target concurrently being simplified and heat-related expansions of the target tube are compensated for.

For this purpose, an end block for a magnetron device having a rotatable target is proposed, which comprises an end block housing having a pivot bearing, the end block housing being implemented on its outer side for attachment on a support unit, and the pivot bearing being implemented on its end which is accessible from outside the end block housing for connection to the rotating target, and the attachment of the end block housing on the support unit being implemented as movable.

In connection with the proposed end block, pivot bearings refer to bearing units which allow a rotatable mounting for the target. For example, they may be shafts which are themselves rotatably mounted in the end block housing and allow a rotationally fixed connection to the target, but also axles or axle stubs, i.e., pins connected rotationally fixed to the end block housing, which allow a rotatable mounting of the target on its end accessible from the outside of the end block housing. To drive the target, the design of the pivot bearing as a shaft is advantageous; however, drive end blocks may also be implemented in which the target is rotatably mounted on a rotationally fixed axis. In the same way, supply end blocks may also have a pivot bearing which is implemented as an axle or shaft.

A support unit on which the end block is movably attached may be a chamber wall or chamber cover of a vacuum coating apparatus, for example, or another support structure situated in the interior of the vacuum coating apparatus for this purpose.

For the movable mounting on a support unit, the end block may be implemented in that, for example, the end block housing has a movable bearing on its outer side.

A movable bearing is understood as a bearing which prevents a displacement of the end block in at least one spatial direction (e.g., the z direction of a Cartesian coordinate system). In other words, a movable bearing may be any type of bearing which allows a displacement of the end block in one spatial direction (e.g., the x or y direction of a Cartesian coordinate system) or one plane (two spatial directions, e.g., the x and y directions of a Cartesian coordinate system), but simultaneously ensures that the end block remains connected to the support unit in every situation. This also includes bearings which prevent a displacement in one spatial direction, but simultaneously permit a rotation around this direction.

In one design, a pendulum mount may be provided on the end block housing, which is connected at one end to the end block housing and is connectable on the other side to a support unit and which is designed so that it allows a movement of the end block housing at least parallel to the rotational axis of the pivot bearing, for example, the drive shaft of a drive end block. In a simple design of a pendulum mount of this type, a rotation of the end block housing around the spatial axis (y axis) transverse to the rotational axis of the pivot bearing (x axis) is also possible, as results, for example, if the target sags as a result of its own weight in the direction of the z axis, i.e., around the y axis. If this is to be prevented, the pendulum mount may be implemented as a parallelogram pendulum, for example, so that a displacement in the x direction is ensured, but a pivot around the y axis is prevented, in contrast.

In another design, a linear guide may be provided on the end block housing, which is connected at one end to the end block housing and is connectable on the other side to a support unit and which is designed so that it allows a movement of the end block housing at least parallel to the rotational axis of the pivot bearing (x axis). It may additionally be provided that a displacement of the end block housing in the y direction is possible.

Furthermore, it may be provided on the end block that a flexible supply line is provided for the electrical supply of the target and/or the supply of the target with a coolant. This case relates to one of the supply end blocks described above.

Alternatively or additionally, it may further be provided that an electric motor for transmitting a torque to the shaft and a flexible supply line for the electrical supply of the electric motor are provided in the end block housing. If this feature is provided both for the electrical supply of the target and for the supply of the target with a coolant, it is a combined drive and supply end block; otherwise it is solely a drive end block.

Furthermore, it is proposed in a vacuum coating apparatus having a vacuum chamber and a magnetron device, which is situated in the vacuum chamber, having a rotating target, which is rotatably mounted on at least one end block, that at least one end block be designed as described above. It is thus possible to avoid the disadvantages of known end blocks described above, so that heat-related expansions of the target are compensated for by a yielding movement of at least one of the end blocks, for example, and the dismounting of used targets and the mounting of new targets is made easier.

In one design, it is therefore provided that the rotating target is mounted on one side on a supply end block for supplying the magnetron device with coolant and electrical power and on the other side on a drive end block for introducing a torque, and the supply end block is mounted fixed and the drive end block is mounted movably.

BRIEF DESCRIPTION OF DRAWING FIGURE

The invention is described in greater detail hereafter on the basis of an exemplary embodiment and an associated drawing. In the single FIGURE:

FIG. 1 shows a section through the vacuum chamber of a vacuum coating apparatus having a side view of a magnetron device.

DETAILED DESCRIPTION

A magnetron device is shown in a vacuum chamber 1, in which a rotating target 3 is situated between a supply end block 2 and a drive end block 4. The target 3 is rotatably mounted at each end on one of the two end blocks 2, 4. The chamber wall, the chamber cover in the exemplary embodiment, forms the support unit 11 for the end blocks 2, 4.

The supply end block 2 comprises an end block housing 21, which is connected fixed to the support unit 11 via an insulation element 23, having a pivot bearing 22 for the rotatable mounting of the target 3, which is accessible in the interior of the vacuum chamber 1 from the outside of the end block housing 21 and is implemented to receive the target 3. To supply the target 3 with electrical power and a coolant, an opening 12 is provided in the chamber wall, through which a supply line 24 for electrical power and a coolant is guided. Because of the fixed connection between the supply end block 2 and the support unit 11, this supply line 24 does not have to be flexible.

A drive end block 4, which comprises an end block housing 41, connected fixed to a pendulum mount 6 via an insulation element 43, having a pivot bearing 42 for the rotatable mounting of the target 3, is situated opposite to the supply end block 2. The pivot bearing 42 is implemented so it is accessible in the interior of the vacuum chamber 1 from the outside of the end block housing 41 and for receiving the target 3. The pivot bearing 42 is implemented here as a shaft which is rotatably mounted in the end block housing 41, to whose end lying in the interior of the end block housing 41 an electric motor 5 situated there is connected for transmitting a torque, in order to drive the target 3.

The pendulum mount 6 comprises an attachment plate 61 for connection to the insulation element 43 and the end block housing 41, a pendulum arm 62, which is articulated on the attachment plate 61, and a bell 63, which is connected to the support unit 11, i.e., the outside of the chamber wall, and on which the pendulum arm 62 is articulated, so that the pendulum arm 62 projects through an opening 12, which is provided in the chamber wall, into the interior of the vacuum chamber 1.

The pendulum mount 6 allows a displacement of the end block housing 41 in the x direction, so that expansions of the target 3 are compensated for and maintenance work is made easier. A displacement in the z direction occurs simultaneously with a displacement of the end block housing 41 in the x direction, which is smaller the longer the pendulum arm 62 is. This may be influenced by a corresponding selection of the height of the bell 63.

To supply the electric motor 5 with electrical power, a supply line 44 which extends from the top of the bell 63 up to the attachment plate 61 of the pendulum mount 6 is provided, which is implemented as flexible in the exemplary embodiment in order to compensate for movements of the end block housing 41. A corrugated hose made of metal may be used for this purpose, for example.

Both end blocks 2, 4 are enclosed by a shield 25, 45 in each case, which are used to avoid undesired discharges and sputtering attacks and coatings on the end block housing 21, 41 and pivot bearing 22, 42.

The invention claimed is:

1. An end block for a magnetron device having a rotating target, comprising an end block housing having a pivot bearing rotatably mounting an end of the target for target rotation about a rotational axis of the pivot bearing, the end block housing being adapted on an outer side for attachment on a support unit, and the pivot bearing being adapted on an end which is accessible from outside the end block housing, for connection to the rotating target, wherein the end block housing is movably attached on the support unit by a movable bearing on the outer side of the end block, the movable bearing preventing displacement of the end block in at least one spatial direction and allowing movement of the end block at least parallel to the rotational axis of the pivot bearing.

2. The end block according to claim 1, wherein the end block housing is connected to the support unit by a pendulum mount that allows movement of the end block housing at least parallel to the rotational axis of the pivot bearing.

3. The end block according to claim 1, wherein the end block housing is connected to the support unit by a linear guide that allows movement of the end block housing at least parallel to the rotational axis of the pivot bearing.

4. The end block according to claim 1, further comprising a flexible supply line for electrical supply of the target and/or supply of the target with a coolant.

5. The end block according to claim 1, further comprising an electric motor for transmitting a torque to the pivot bearing and a flexible supply line for electrical supply of the electric motor, in the end block housing.

6. A vacuum coating apparatus having a vacuum chamber, a magnetron device situated in the vacuum chamber, and a rotating target rotatably mounted on at least one end block, wherein the at least one end block is implemented according to claim 1.

7. The vacuum coating apparatus according to claim 6, wherein the rotating target is mounted on one side on a supply end block for supplying the magnetron device with coolant and electrical power and on an other side on a drive end block for introducing a torque, and the supply end block is mounted fixed and the drive end block is mounted movably by the movable bearing.

8. The end block according to claim 1, wherein said one spatial direction is transverse to the rotational axis of the pivot bearing.

9. The end block according to claim 1, wherein the movable bearing provides force-free support of the end block with respect to the support unit at least parallel to the rotational axis of the pivot bearing.

* * * * *